United States Patent [19]

Yokota

[11] Patent Number: 4,948,969
[45] Date of Patent: Aug. 14, 1990

[54] PHOTODETECTOR HAVING CONVEX WINDOW FOR SHIELDING ELECTROMAGNETIC WAVE AND ELECTROSTATIC INDUCTION NOISES

[75] Inventor: Shouji Yokota, Osaka, Japan

[73] Assignee: Sharp Kabushiki Kaisha, Osaka, Japan

[21] Appl. No.: 305,756

[22] Filed: Feb. 3, 1989

[30] Foreign Application Priority Data

Mar. 29, 1988 [JP] Japan ................. 63-2256[U]

[51] Int. Cl.$^5$ ........................... H01J 5/02
[52] U.S. Cl. ......................... 250/239; 250/216
[58] Field of Search .............. 250/239, 237, 238, 342, 250/347, 353; 455/602, 603

[56] References Cited

U.S. PATENT DOCUMENTS 4,498,767  2/1985  McGovern et al. ............ 250/237 R
4,555,626  11/1985  Suzuki .................... 250/239
4,672,206  6/1987  Suzuki et al. .............. 250/342

FOREIGN PATENT DOCUMENTS 6223182  11/1983  Japan .
61-83921  4/1986  Japan .
61-240126  10/1986  Japan .

Primary Examiner—David C. Nelms

[57] ABSTRACT

A photodetector including a reception portion and a shield casing for performing electromagnetic shielding of the reception portion, in which a light receiving window confronting the reception portion is formed on the shield casing convexly in a direction away from the reception portion and a plurality of holes for directing light signals towards the reception portion are formed on a peripheral surface of the light receiving window.

11 Claims, 5 Drawing Sheets

PHOTODETECTOR HAVING CONVEX WINDOW FOR SHIELDING ELECTROMAGNETIC WAVE AND ELECTROSTATIC INDUCTION NOISES

BACKGROUND OF THE INVENTION

The present invention relates to a photodetector for use in a remote-control apparatus employing near infrared rays, etc. as control signals, for example, a remote-control unit of a television set, a video tape recorder or the like.

Conventionally, a reception portion of a wireless remote-control system based on near infrared rays is constituted by a photosensor (photoelectric conversion device), an amplification circuit, a detection circuit, a waveform shaping circuit, etc. This reception portion handles extremely weak electric signals and therefore, is readily affected by noises produced by electrostatic induction or electromagnetic induction inside and outside the wireless remote-control system, so that operation of the reception portion becomes unstable. Thus, the reception portion is enclosed by a shield casing such that entry of noises into the reception portion is restricted by the shield casing.

However, in order to receive electric signals by the photosensor, a window for receiving light is required to be provided on the shield casing. Hence, in order to prevent entry of noises into the reception portion through the window, various countermeasures shown in FIGS. 1 to 5 have been taken so far. In FIG. 1, a light receiving window 3 is formed as small as possible on a front face of a shield casing 2 of a reception portion 1. In FIG. 2, the light receiving window 3 is constituted by a conductive metal gauze. In FIG. 3, the light receiving window 3 is constituted by a plurality of slits as disclosed in Japanese Utility Model Publication (examined) No. 23182/1987. Meanwhile, in FIGS. 4 and 5, the light receiving window 3 on the front face of the shield casing 2 is constituted by a plurality of holes 4.

However, in the known arrangement of FIG. 1, since the diameter of the light receiving window 3 cannot be made so small due to restriction of directivity characteristics of the reception portion 1, the shield casing 2 cannot shield the reception portion 1 fully from noises. In the known arrangement of FIG. 2, directivity characteristics are inferior. Furthermore, in the known arrangement of FIG. 2, since the light receiving window 3 is constituted by the metal gauze separate from the shield casing 2, its production cost becomes high. Meanwhile, in the known arrangement of Fig. 3, since the slits extend longitudinally in the vertical direction of the shield casing 2 and opposite sidewalls of each of the slits are directed towards the photosensor, directivity characteristics for light signals proceeding in the lateral direction of the shield casing 2 are excellent but directivity characteristics for light signals proceeding in the vertical direction of the shield casing 2 become poor. Furthermore, in the known arrangement of FIGS. 4 and 5, since areas of the holes effective against light signals 5 proceeding obliquely relative to the front face of the shield casing 2 are substantially reduced as shown in Fig. 5, the amount of the light signals 5 received by a photosensor 6 is reduced, thereby resulting in deterioration of its directivity characteristics.

SUMMARY OF THE INVENTION

Accordingly, an essential object of the present invention is to provide, with a view to eliminating the disadvantages inherent in conventional photodetectors, a photodetector which achieves excellent shielding effects against noises and has improved directivity characteristics.

As shown in FIGS. 6 and 7, in order to accomplish this object of the present invention, a photodetector embodying the present invention includes a reception portion 1 and a shield casing 2 for performing electromagnetic shielding of said reception portion 1, the improvement comprising: a light receiving window 3 which is formed on said shield casing 2 convexly in a direction away from said reception portion 1 so as to confront said reception portion 1 and a plurality of holes 4 which are so formed on a peripheral surface of said light receiving window 3 as to direct light signals 5 towards said reception portion 1.

In the photodetector of the present invention, the light signals 5 of near infrared rays transmitted from a remote-control transmitter pass through the holes 4 of the light receiving window 3 to a sensor chip 7 of a photosensor 6. At this time, entry of noises into the shield casing 2 takes place more readily as diameter of the holes 4 is made larger. On the contrary, shielding effects of the shield casing 2 against noises are enhanced as diameter of the holes 4 is made smaller. In the photodetector of the present invention, since a plurality of the holes 4 are formed on the light receiving casing 3, not only a required amount of the light signals 5 can be passed through the holes 4 but shielding effects of the shield casing 2 against noises can be improved.

Moreover, in the photodetector of the present invention, since the light receiving window 3 is formed convexly in the direction away from the reception portion 1 and the holes 4 are formed on the peripheral surface of the light receiving window 3 such that opposite sidewalls 4a of each of the holes 4 are directed towards the photosensor 6, even the light signals 5 proceeding obliquely relative to the front face of the shield casing 2 can be received by the photosensor 6 even if the holes 4 have a small diameter.

Therefore, in the photodetector of the present invention, since reduction of areas of the holes 4 effective against the light signals proceeding obliquely relative to the front face of the shield casing 2 can be restricted, a region enabling remote control can be expanded remarkably through improvement of its directivity characteristics.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

This object and features of the present invention will become apparent from the following description taken in conjunction with the preferred embodiments thereof with reference to the accompanying drawings which are given by way of illustration only, and thus are not limitative of the present invention, and, in which.

Before the description of the present invention proceeds, it is to be noted that like parts are designated by like reference numerals throughout several views of the accompanying drawings.

DETAILED DESCRIPTION OF THE INVENTION

Figure 1:
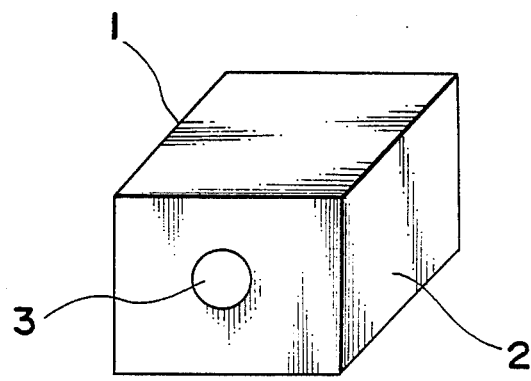
FIGS. 1 to 4 are perspective views of prior art photodetectors, respectively (already referred to)
Figure 2:
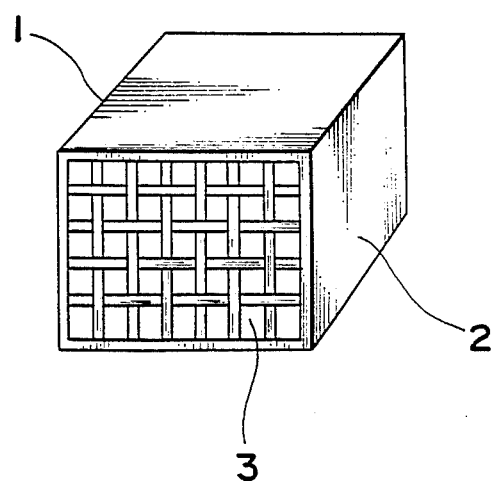
Figure 3:
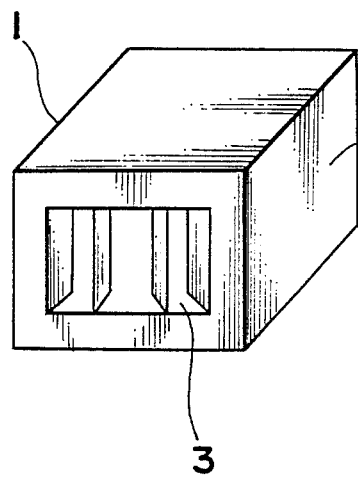
Figure 4:
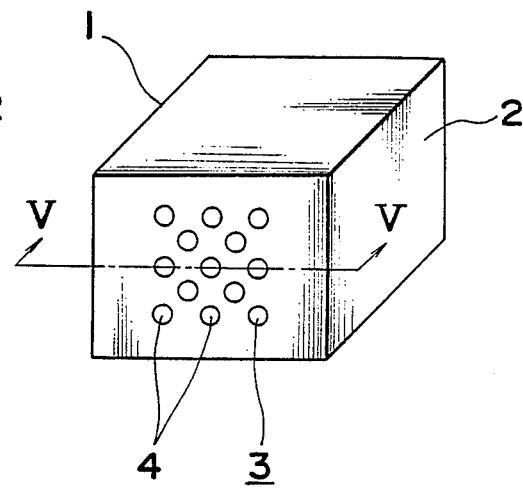
Figure 5:
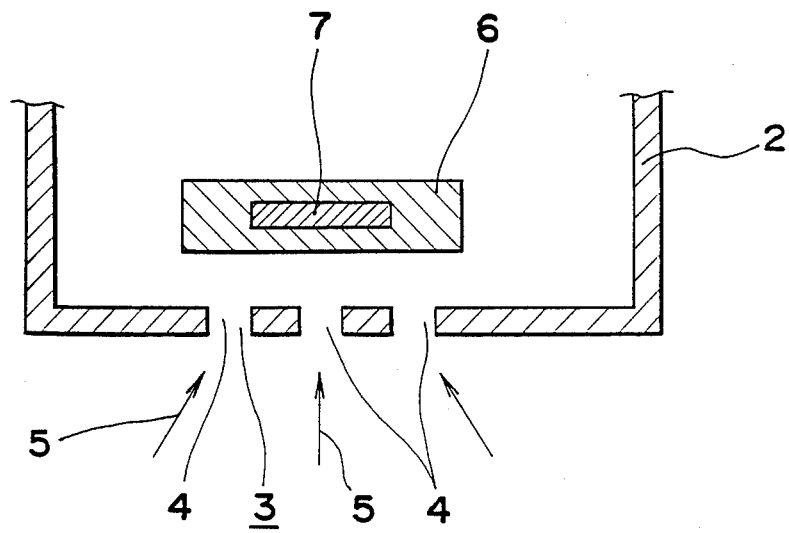
FIG. 5 is a fragmentary sectional view taken along the line V—V in FIG. 4 (already referred to)
Figure 6:
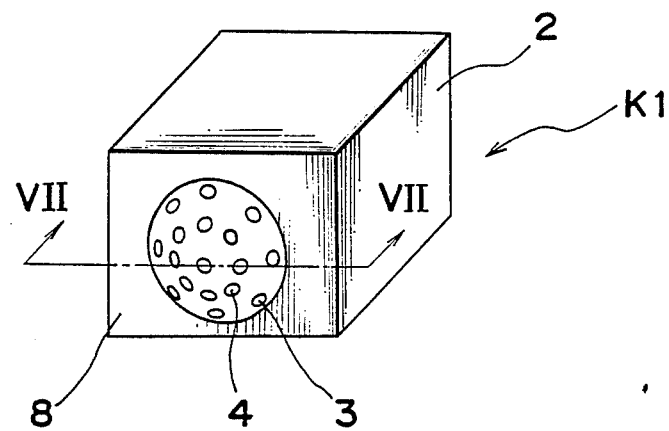
FIG. 6 is a perspective view of a photodetector according to a first embodiment of the present invention.
Figure 7:
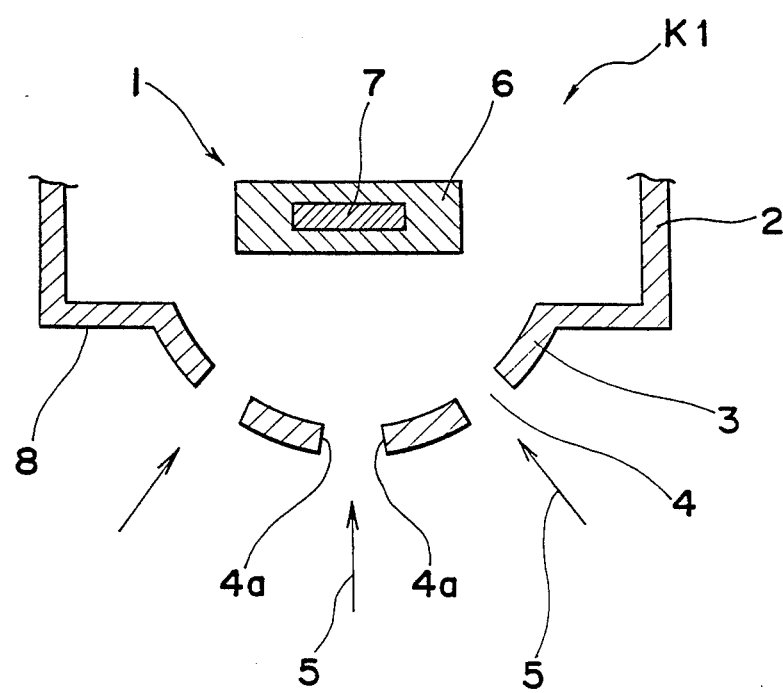
FIG. 7 is a fragmentary sectional view taken along the line VII—VII in FIG. 6.

Referring now to the drawings and in particular FIGS. 6 and 7, a photodetector K1 is shown for use in a remote-control apparatus, according to a first embodiment of the present invention. The photodetector K1 includes a reception portion 1 and a shield casing 2 for performing electromagnetic shielding of the reception portion 1 and a light receiving window 3. The light receiving window 3 is formed integrally with a front face 8 of the shield casing 2 and confronts the reception portion 1 so as to be projected convexly in a direction away from the reception portion. Furthermore, a plurality of circular holes 4 are so formed on a whole peripheral surface of the light receiving window 3 as to direct light signals 5 towards the reception portion 1.

The reception portion 1 is constituted by a photosensor 6, an amplification circuit, a detection circuit, a waveform shaping circuit, etc. The photosensor 6 is constituted by a photodiode and includes a sensor chip (photodiode chip) 7. The photosensor 6 is disposed rearwards of the light receiving window 3.

The shield casing 2 is made of electrically conductive material and has a shape of rectangular parallelepiped. In order to shield the reception portion 1 from noises produced through electrostatic induction or electromagnetic induction inside and outside the remote-control apparatus, the reception portion 1 is accommodated in the shield casing 2. The convex surface of the light receiving window 3 has a hemispherical shape. A plurality of the circular holes 4 are formed on the light receiving window 3 so as to be distributed radially with the vertex of the hemispherical surface of the light receiving window 3 as the center. Each of the holes 4 is of such a diameter of, for example, 1.2 mm as to sufficiently reduce entry of noises into the shield casing 2 and the number of the holes 4 is set to such a value as to secure a necessary amount of the light signals 5 for the reception portion 1. Moreover, opposite sidewalls 4a of each of the holes 4 are formed in a direction perpendicular to the hemispherical surface of the light receiving window 3 so as to be directed towards the photosensor 6 of the reception portion 1.

In the above described arrangement of the photodetector K1, the light signals 5 of near infrared rays transmitted from a remote-control transmitter pass through the holes 4 of the light receiving window 3 into the shield casing 2 and are converted into electric signals by the sensor chip 7 of the photosensor 6 so as to be outputted to a signal decoding circuit via the amplification circuit, the detection circuit, etc. At this time, entry of noises into the shield casing 2 occurs more readily as diameter of the holes 4 is increased. On the contrary, shielding effects of the shield casing 2 against noises are enhanced as diameter of the holes 4 is reduced. In the photodetector K1, since a plurality of the holes 4 are formed on the light receiving window 3, a necessary amount of the light signals 5 for the reception portion 1 can be passed through the holes 4 and shielding effects of the shield casing 2 against noises can be improved.

Meanwhile, in the photodetector K1, the light receiving window 3 is formed convexly. In addition, the holes 4 are formed on the whole peripheral surface of the light receiving window 3 and the opposite sidewalls 4a of each of the holes 4 are formed in the direction perpendicular to the hemispherical surface of the light receiving window 3 so as to be directed towards the photosensor 6. Therefore, in the photodetector K1, even if diameter of the holes 4 is small, even the light signals 5 travelling obliquely relative to the front face 8 of the shield casing 2 can be received by the photosensor 6.

As described above, in the photodetector K1, since reduction of areas of the holes 4 effective against the light signals 5 proceeding obliquely relative to the front face 8 of the shield casing 2 can be restricted, a reduction in the amount of the light signals 5 to be inputted to the photosensor 6 is lessened, so that a region enabling remote control can be expanded extraordinarily through improvement of its directivity characteristics.

Therefore, in the light receiving window 3 of the photodetector K1, the optical signals proceeding obliquely relative to the front face of the shield casing 2 can be supplied to the photosensor 6 with a small loss and the reception portion 1 can be sufficiently shielded from external noises, so that remote-control of the remote-control apparatus can be performed stably.

Figure 8:
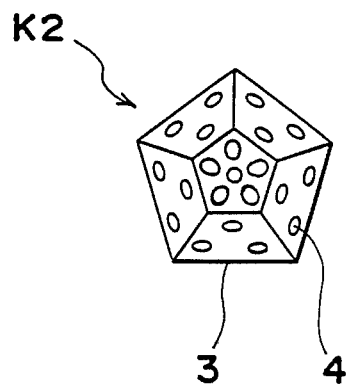
FIGS. 8 and 9 are front elevational views of light receiving windows employed in photodetectors according to second and third embodiments of the present invention, respectively.
Figure 9:
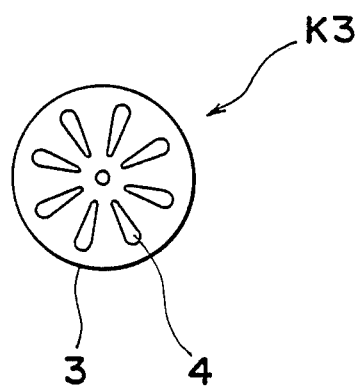

Meanwhile, the photodetector of the present invention is not restricted to that of the above embodiment but can be modified variously. For example, as shown in FIG. 8, the light receiving window 3 is not restricted to the hemispherical shape but can be formed into a shape of a polygonal pyramid in a photodetector K2 according to a second embodiment of the present invention. Meanwhile, as shown in FIG. 9, each of the holes 4 of the light receiving window 3 is not restricted to a circular shape but can be replaced by an elongated opening extending radially with the vertex of the convex surface of the light receiving window 3 as its center in a photodetector K3 according to a third embodiment of the present invention.

Figure 10:
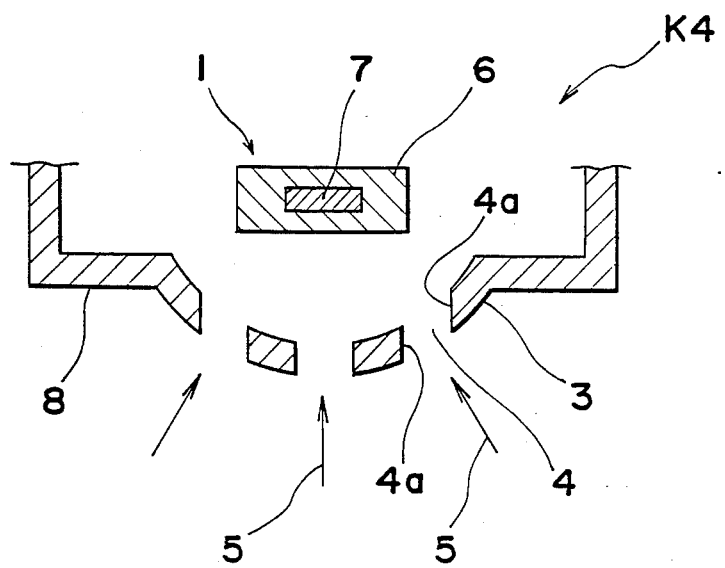
FIG. 10 is a view similar to FIG. 7, particularly showing a fourth embodiment of the present invention.

Furthermore, as shown in FIG. 10, the opposite sidewalls 4a of each of the holes 4 are not so restricted as to be formed in the direction perpendicular to the hemispherical surface of the light receiving window 3 but can be formed, in parallel with each other, in a direction perpendicular to the front face 8 of the shield casing 2 in a photodetector K4 according to a fourth embodiment of the present invention. In the photodetector K4, the holes 4 can be machined more easily than the photodetector K1.

Figure 11:
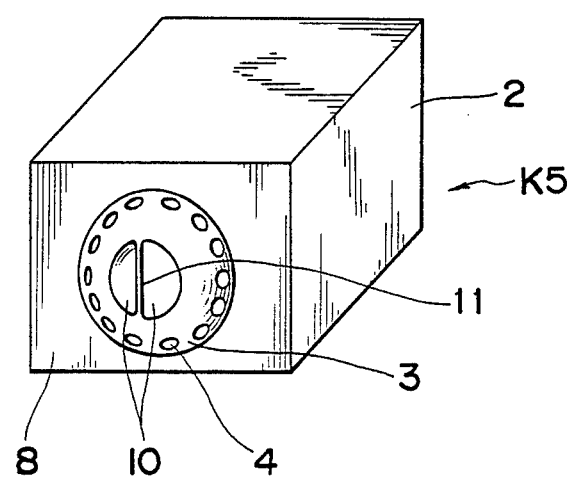
FIG. 11 is a view similar to FIG. 6, particularly showing a fifth embodiment of the present invention.

Referring finally to FIG. 11, a photodetector K5 according to a fifth embodiment of the present invention is shown. In the photodetector K5, a plurality of the holes 4 are formed along a circular base of the hemispherical surface of the light receiving window 3 and a pair of semicircular openings 10 separated from each other by a rib 11 are formed at the vertex of the hemispherical surface of the light receiving window 3. Since other constructions of the photodetector K5 are similar to those of the photodetector K1, description thereof is abbreviated for the sake of brevity.

In addition, the light receiving window 3 is not necessarily required to be formed integrally with the shield casing 2 but can also be provided separately from the shield casing 2.

As is clear from the foregoing, in the photodetector of the present invention, the light receiving window confronting the reception portion is convexly formed on the shield casing and a plurality of the holes are so formed on the peripheral surface of the light receiving window as to direct the light signals towards the reception portion. Accordingly, in accordance with the present invention, shielding effects of the shield casing against noises produced inside and outside the remote-control apparatus are enhanced and a wide remote-control region can be obtained through improvement of directivity characteristics.

Furthermore, in accordance with the present invention, since shielding effects of the shield casing against noises are enhanced, the reception portion can be disposed in close vicinity to the noise sources, thus resulting in saving of space required for the remote-control apparatus.

Moreover, in accordance with the present invention, since the light receiving window is obtained by machining the shield casing itself, such an excellent effect as reduction of production cost of the photodetector can be achieved.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A photodetector comprising:
  a reception portion and a shield casing for preventing electromagnetic wave and electrostatic induction noises from outside of the photodetector from entering said reception portion to thereby electromagnetically shield said reception portion;
  a light receiving window which is formed on said shield casing convexly in a direction away from said reception portion so as to confront said reception portion; and
  a plurality of holes which are so formed on a peripheral surface of said light receiving window as to direct light signals towards said reception portion.

2. The photodetector as claimed in claim 1, wherein a convex surface of said light receiving window has a hemispherical, shape.

3. The photodetector as claimed in claim 2, wherein each of said holes has a circular shape.

4. The photodetector as claimed in claim 2, wherein said holes are formed in a direction perpendicular to the hemispherical surface of said light receiving window.

5. The photodetector as claimed in claim 3, wherein said holes are formed in a direction perpendicular to the hemispherical surface of said light receiving window.

6. The photodetector as claimed in claim 1, wherein a convex surface of said light receiving window has a shape of a polygonal pyramid.

7. The photodetector as claimed in claim 2, wherein each of said holes is constituted by an elongated opening extending radially with a vertex of the hemispherical surface of said light receiving window as its center.

8. The photodetector as claimed in claim 6, wherein each of said holes is constituted by an elongated opening extending radially with a vertex of the polygonal pyramid of said light receiving window as its center.

9. The photodetector as claimed in claim 2, wherein said light receiving window is formed on a face of said shield casing and said holes are formed, in parallel with each other, in a direction perpendicular to said face of said shield casing.

10. The photodetector as claimed in claim 3, wherein said light receiving window is formed on a face of said shield casing and said holes are formed, in parallel with each other, in a direction perpendicular to said face of said shield casing.

11. The photodetector as claimed in claim 3, wherein said holes are formed along a circular base of the hemispherical surface of said light receiving window and a pair of semicircular openings are formed at a vertex of the hemispherical surface of said light receiving window.

* * * * *